US005691225A

United States Patent [19]
Abiko

[11] Patent Number: 5,691,225
[45] Date of Patent: Nov. 25, 1997

[54] METHOD FOR FABRICATING SEMICONDUCTOR DEVICE HAVING CMOS STRUCTURE

[75] Inventor: Hitoshi Abiko, Tokyo, Japan

[73] Assignee: NEC Corporation, Tokyo, Japan

[21] Appl. No.: 739,781

[22] Filed: Oct. 30, 1996

[30] Foreign Application Priority Data

Oct. 31, 1995 [JP] Japan .................................. 7-308355

[51] Int. Cl.$^6$ .................................................. H01L 21/70
[52] U.S. Cl. ............................ 437/57; 437/34; 437/200
[58] Field of Search ................................ 437/34, 56, 57, 437/58, 200

[56] References Cited

PUBLICATIONS

Tohru Ogami et al, "A Novel Salicide Process (SEDAM) for Sub–Quarter Micron CMOS Devices", *1994 IEDM Technical Digest*, pp. 687–690.

T. Ohguro et al, "The Influence of Oxygen at Epitaxial Si/Si Substrate Interface for 0.1μm Epitaxial Si Channel N–MOS-FETs Grown by UHV–CVD", *1995 Symposium on VLSI Technology Digest of Technical Papers*, pp.21–22.

*Primary Examiner*—John Niebling
*Assistant Examiner*—Long Pham
*Attorney, Agent, or Firm*—Sughrue, Mion, Zinn, Macpeak & Seas, PLLC

[57] ABSTRACT

A semiconductor device having a CMOS structure having a low resistivity silicide layer in a source/drain region is fabricated. To realize silicide formation for resistivity reduction of the n-type source/drain region, an impurity-free silicon layer is formed thereon before forming a high melting point metal silicide layer. For the n-type source/drain region, ion implantation is made through the silicon layer. It is thus possible to obtain a shallow junction of the p-type source/drain region, prevent ion implantation time increase and obtain quick fabrication without reducing the ion implantation energy.

15 Claims, 8 Drawing Sheets

METHOD FOR FABRICATING SEMICONDUCTOR DEVICE HAVING CMOS STRUCTURE

BACKGROUND OF THE INVENTION

(1) Field of the Invention

The present invention relates to a method for fabricating a semiconductor device, and more particularly to a method for fabricating a semiconductor device which has a CMOS structure and which has a low resistivity silicide layer in a source/drain region and enables realization of miniaturized MOS transistor structures.

(2) Description of the Related Art

With a recent trend for miniaturizing semiconductor devices, the source/drain region area is decreasing, and the electrical resistance of interconnects connected to this region is increasing. For increasing operation speed, a semiconductor device has been proposed, which has MOS transistors with a low resistivity, high melting point metal silicide layer in the source/drain region. Where a semiconductor device is applied to a semiconductor device having a CMOS structure having a p-channel MOS transistor and an n-channel MOS transistor, a process shown in FIGS. 1A and 1B has been adopted.

As shown in FIG. 1A, an n-type well 102 is formed in a surface region of a p-type silicon substrate 101, and an element isolation insulating film 103, a gate insulating film 104 and a gate electrode 105 are formed on a surface portion of the substrate 101. Then, a p-type LDD 109 and a source/drain region 115 are formed in the n-type well 102 by introducing a p-type impurity thereinto. Likewise, an n-type LDD 107 and an n-type source/drain region 112 are formed in the p-type silicon substrate 101 by introducing an n-type impurity thereinto. Then, after depositing on the entire surface a high melting point metal 116 such as titanium or cobalt, the structure is thermally treated to cause a reaction between the high melting point metal 116 and the silicon, and the high melting point metal that has not reacted is etched away. As shown in FIG. 1B, a low resistivity silicide layer 117 is selectively formed in the source/drain regions 112 and 115 as a result of this process.

However, it was found that, with the above method for fabrication, the resistance of the silicide layer 117 formed in the n-type source/drain region 112 is increased with a reduction in the pattern width. This is attributable to the fact that the presence impurities such as arsenic and phosphorus forming the n-type source/drain region 112 at a high concentration on the silicon surface, hinders the reaction between the high melting point metal and the silicon, thus degrading the properties for lower resistivities.

Another problem in the prior art semiconductor device having the CMOS structure, is that it is difficult to make the p-type MOS transistor structure finer. For forming the p-type MOS transistor source/drain region 115, it is necessary to make the n-type well 102 active by ion implanting $1 \times 10^{15}$ to $1 \times 10^{16}$ cm$^{-2}$ of a p-type impurity, such as boron or BF$_2$ into the n-type well 102. This means that the miniaturization of p-type MOS transistor structure requires reducing the energy of ion implantation and thus reducing the impurity layer junction depth. With the present ion implantation techniques, the lower limit of the ion implantation energy is about 10 keV. Besides, with ion implantation energies of 30 keV and below, the ion implantation current is inevitably reduced resulting in a large increase of the ion implantation time, and this increases the time and cost of semiconductor device fabrication.

A solution to these problems, particularly the problem of the increase of the resistance of the silicide layer 117 in the n-type source/drain region 112, has been proposed in, for instance, 1994 IEDM Technical Digest, pp. 687–690. As shown in FIG. 2, in this proposed method, after forming an n-type source/drain region 112, a high melting point metal is deposited on the entire surface of an impurity-free silicon layer 113, which has been formed through epitaxial growth of silicon on the n-type source/drain region 112, and then the structure is thermally treated to cause a reaction between the high melting point metal and impurity-free silicon layer, thus forming a silicide layer. With this method, it is indeed possible to suppress resistivity increase of the silicide layer in the n-type source/drain region, but it is difficult to meet the demand for quickly forming the shallow junction p-type source/drain region.

SUMMARY OF THE INVENTION

An object of the invention is to overcome the problems existing in the prior art, and to provide a method for fabricating a semiconductor device having a CMOS structure, which permits resistivity reduction of the silicide layer in the n-type source/drain region, and also enables quick formation of a shallow junction p-type source/drain region, thus permitting the structure to be miniaturized and the operation speed to be increased.

According to one aspect of the invention, there is provided a method for fabricating a semiconductor device which has a p-type MOS transistor and an n-type MOS transistor and also has a high melting point metal silicide layer formed at least on a source/drain region of each MOS transistor, the method comprising the steps of:

forming the source/drain region of the n-type MOS transistor through impurity introduction after forming a gate insulating film and a gate electrode of each of the MOS transistors on a silicon substrate;

forming a silicon layer on each of the source/drain regions of the n- and p-type MOS transistors;

forming the source/drain region of the p-type MOS transistor through the silicon layer; and forming the high melting point metal silicide layer by depositing a high melting point metal over an entire surface and causing a reaction of the high melting point metal with the silicon layer.

In the n-type MOS transistor of the semiconductor device according to the invention, the silicide layer of the high melting point metal is formed after forming the impurity-free silicon layer on the source/drain region. It is thus possible to reduce the resistivity of the n-type source/drain region. Besides, the silicide layer of high melting point metal can also be formed in the source/drain region of the p-type MOS transistor. It is thus not necessary to reduce the ion implantation energy, thus enabling the formation of a shallow p-type transistor source/drain region, the prevention of ion implantation time increase, and the quick and low cost fabrication.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1A:
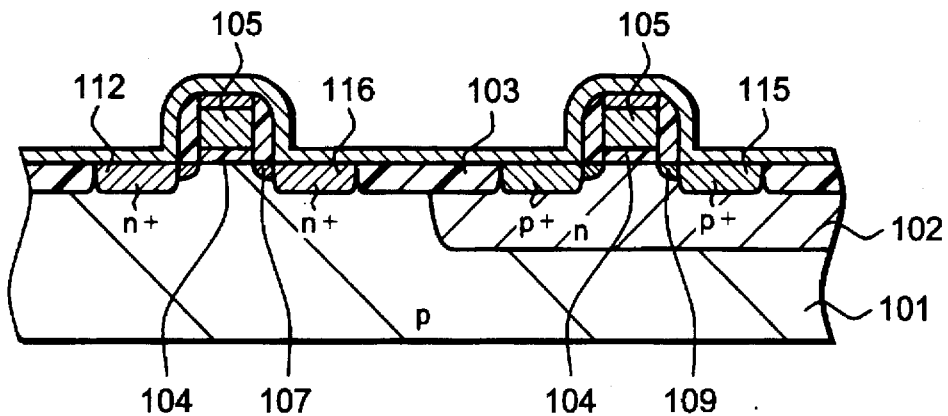
FIGS. 1A and 1B are sectional views of a conventional semiconductor device for use in explaining steps of a method for fabricating the same.
Figure 1B:
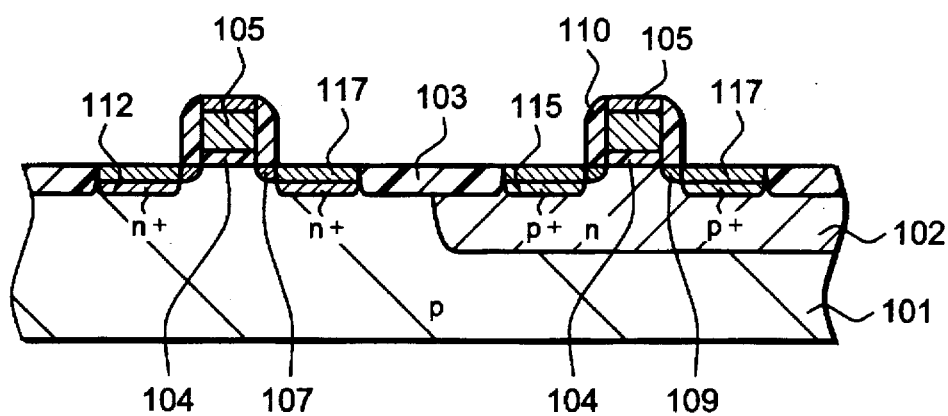
Figure 2:
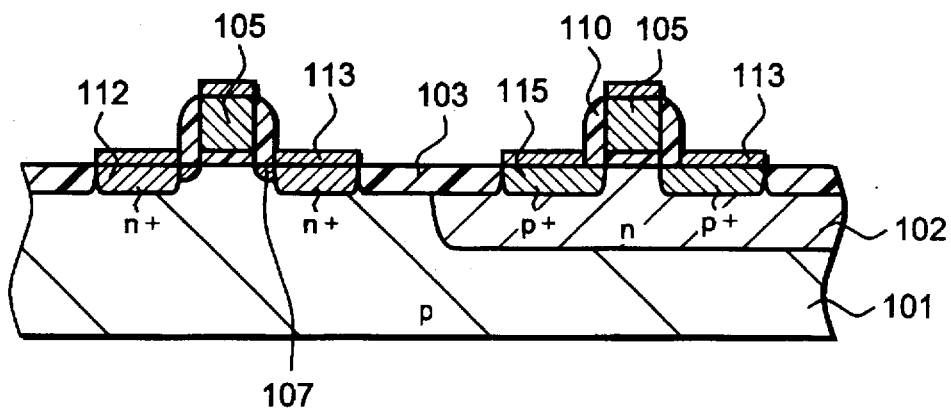
FIG. 2 is a sectional view of another conventional semiconductor device for use in explaining steps of a method for fabricating the same.
Figure 3A:
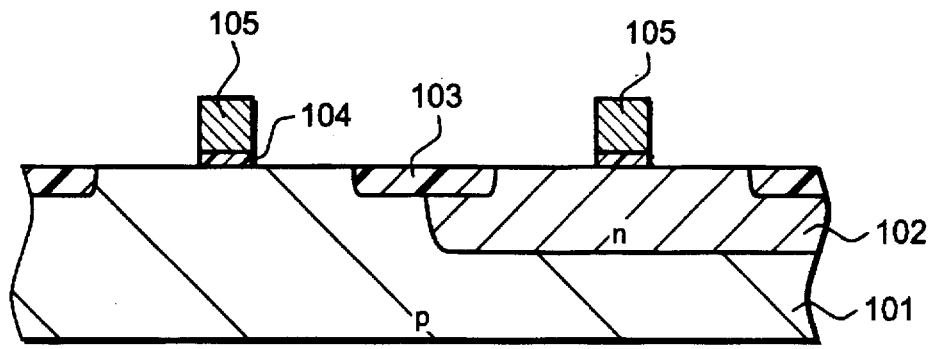
FIGS. 3A to 3J are sectional views of a semiconductor device for use in explaining a method for fabrication of a first embodiment according to the invention.
Figure 3B:
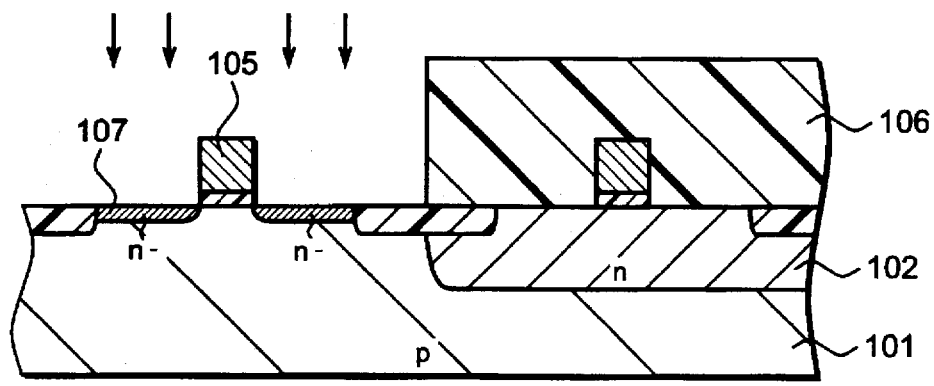
Figure 3C:
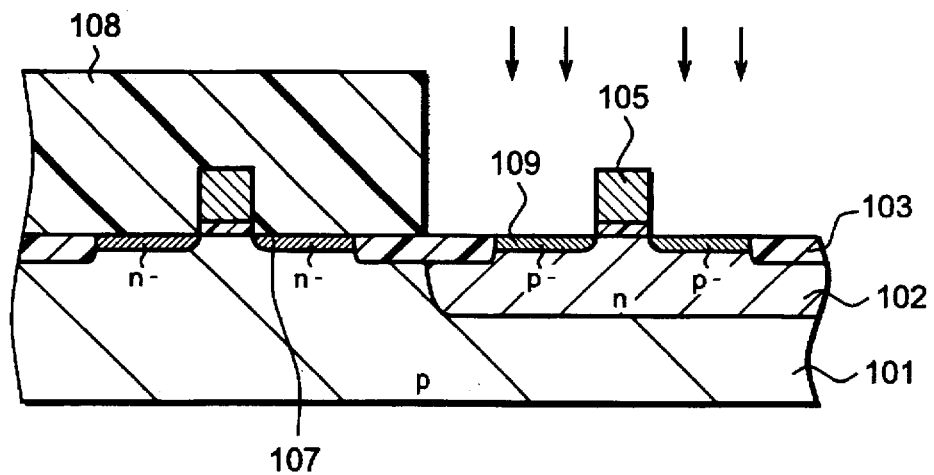

FIGS. 3A to 3J are sectional views showing sequential steps of the method for fabricating a semiconductor device of a first embodiment of the invention. As shown in FIG. 3A, after forming an n-type well 102 in a p-type silicon substrate 101, an element isolation insulating film 103, a gate insulating film 104 and a gate electrode 105 are formed such that they are continuous on a surface portion of the p-type silicon substrate 101. In this embodiment, the gate electrode 105 is a single layer of polysilicon, but it may be a silicide/polysilicon laminated layer as well. As shown in FIG. 3B, subsequently, a p-type MOS transistor region is covered with photo-resist 106, and a low impurity concentration source/drain region, i.e., an n-type LDD region 107, is formed in an n-type MOS transistor region by ion implanting an n-type impurity to a concentration of $2 \times 10^{13}$ cm$^{-2}$ at an energy of 30 keV. As shown in FIG. 3C, the n-type MOS transistor region is then covered with a photo-resist 108, and a p-type LDD region 109 is formed in the p-type MOS transistor region by ion implanting a p-type impurity at a concentration of $2 \times 10^{13}$ cm$^{-2}$ at an energy of 10 keV. The LDD regions 107 and 109 are then made active by a heat treatment at 1,000° C. for 10 seconds.

Figure 3D:
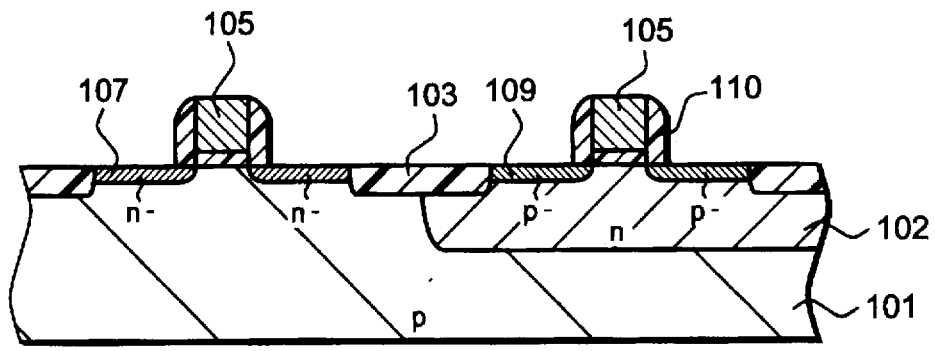
Figure 3E:
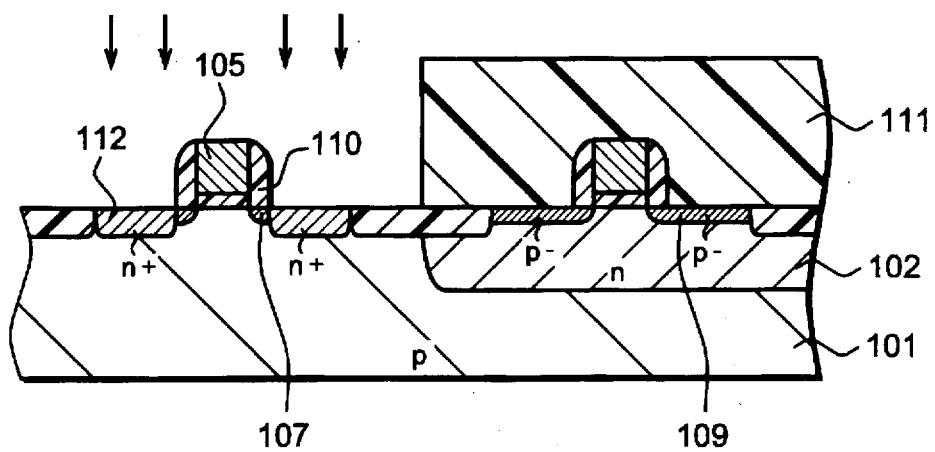

A silicon oxide film is deposited over the entire surface and anisotropically etched, thus forming side walls 110 on the sides of the gate electrode 105 as shown in FIG. 3D. As shown in FIG. 3E, the p-type MOS transistor region is then covered with photo-resist 111, and a high impurity concentration n-type source/drain region 112 is formed in a source-drain formation region of the n-type MOS transistor by ion implanting an n-type impurity such as arsenic to a concentration of $3 \times 10^{15}$ cm$^{-2}$ at an energy of 30 keV and then heat treating at 1,000° C. for 10 seconds for activation.

Figure 3F:
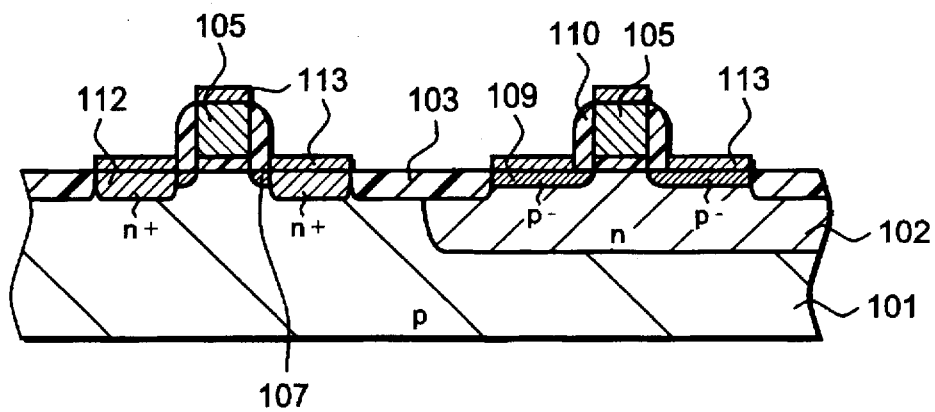
Figure 3G:
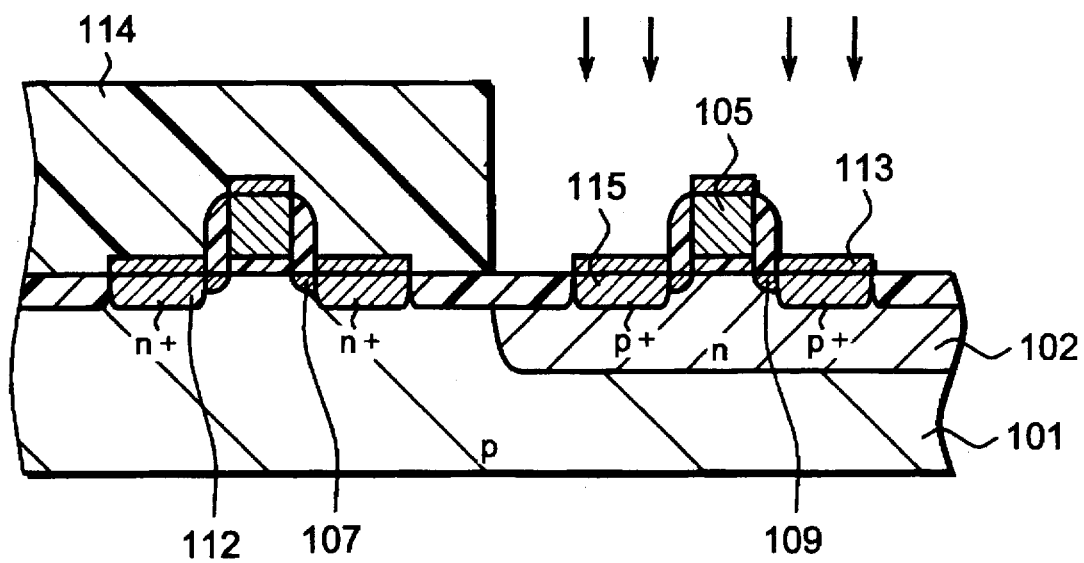

As shown in FIG. 3F, an epitaxial silicon layer 113 is then epitaxially grown on a region, in which silicon is exposed, in an atmosphere of $Si_2H_6$ under conditions of $10^{-3}$ Pa (Pascal) and 600° to 700° C. For the selective epitaxial growth process, reference is made to a technique shown in 1995 Symposium on VLSI Technology Digest of Technical Papers, pp. 21-22. As shown in FIG. 3G, the n-type MOS transistor region is then covered with photo-resist 114, a high impurity concentration p-type source/drain region 115 of a p-type MOS transistor is formed in the p-type MOS transistor region by ion implanting a p-type impurity such as $BF_2$ to a concentration of $3 \times 10^{15}$ cm$^{-2}$ at an energy of 30 keV and heat treating at 1,000° C. for 10 seconds for activation. The source/drain region 115 thus formed, compared to the case of making ion implantation without epitaxial growth, has a smaller junction depth under the surface of the substrate 101 prior to the epitaxial growth by the thickness of the epitaxial silicon layer 113. When the silicon layer 113 is 30 nm in thickness, for example, the channel length is reduced by about 0.1 μm compared to the case when the ion implantation is made without epitaxial growth.

Figure 3H:
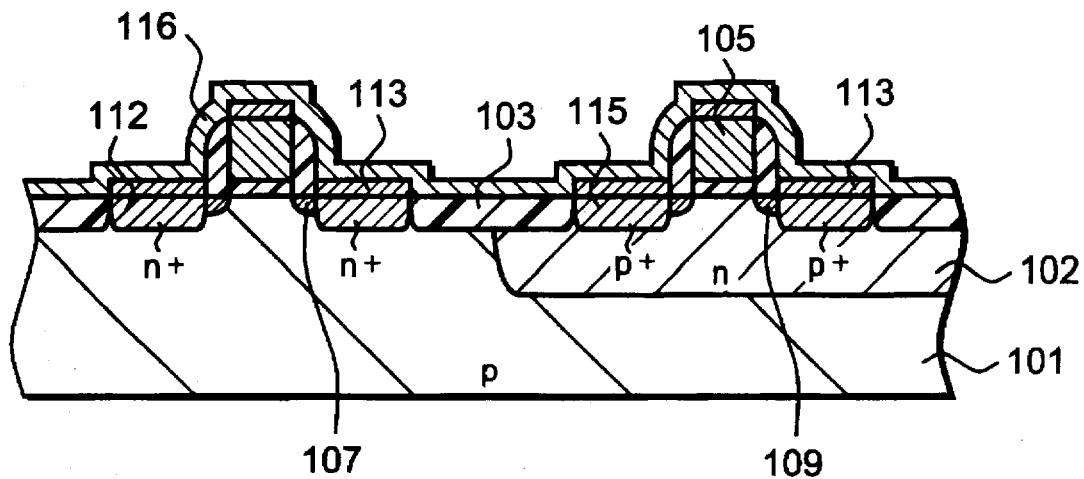
Figure 3:
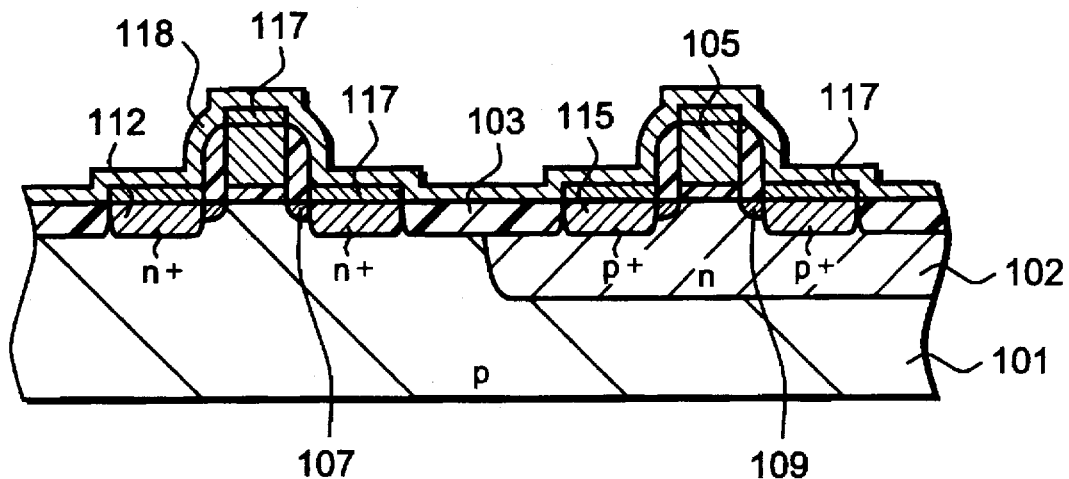

As shown in FIG. 3H, titanium 116, for instance, is then deposited to a thickness of 30 nm over the entire surface, and then the structure is heat treated in a nitrogen atmosphere at 640° C. for 20 seconds to cause a silicide reaction between the impurity-free epitaxial silicon layer 113 and titanium 116 in the n-type MOS transistor and between the epitaxial silicon layer 113 containing $BF_2$ and titanium 116 in the p-type MOS transistor. As shown in FIG. 3I, a titanium silicide layer 117 is formed to a thickness of about 30 nm in a surface portion of the silicon layer 113, while titanium nitride 118 is formed on the titanium silicide layer 117. No titanium silicide layer is formed on the side wall 110, which thus consists solely of titanium nitride 118. The titanium silicide layer 117 thus formed consists of high resistivity titanium silicide called "C49 structure".

Figure 3J:
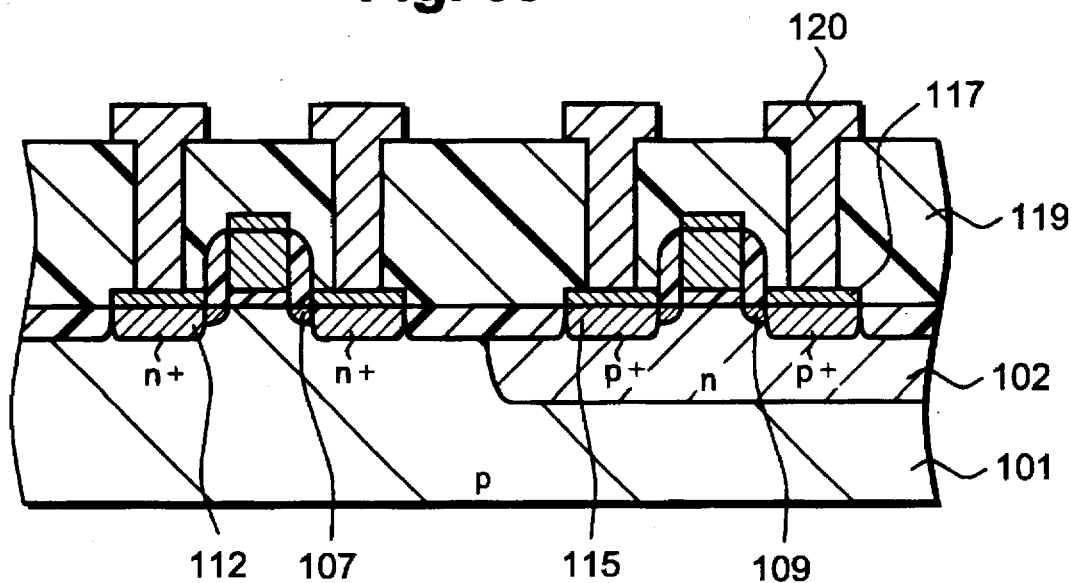

Afterwards, the titanium nitride 118 is selectively removed with a mixed solution containing ammonia and hydrogen peroxide to leave in place a titanium silicide layer 117 selectively on the source/drain regions 112 and 115 and the gate electrode 105. The structure is then heat treated in a nitrogen atmosphere at 850° C for 10 seconds, whereby the titanium silicide layer having the high resistivity C49 structure is phase converted to a C56 structure of low resistivity so that the titanium silicide layer 117 has a resistivity of about 7 Ω/□. As shown in FIG. 3J, an inter-layer insulating film 119 and a metal interconnect 120 are formed by a well-known method, thus completing a semiconductor device having a CMOS structure.

In this embodiment, the impurity-free epitaxial silicon layer 113 is formed on the source/drain region 112 of the n-type MOS transistor before the formation of the silicide layer 117 of high melting point metal. It is thus possible to realize resistivity reduction of the n-type source/drain region 112. In addition, the source/drain region 115 of the p-type MOS transistor is formed by ion implantation through the epitaxial silicon layer 113 having been epitaxially grown. The source/drain region 115 thus formed may have a shallow junction depth. It is thus not necessary to reduce the ion implantation energy, thus preventing ion implantation time increase and permitting quick and low cost manufacture.

Figure 4A:
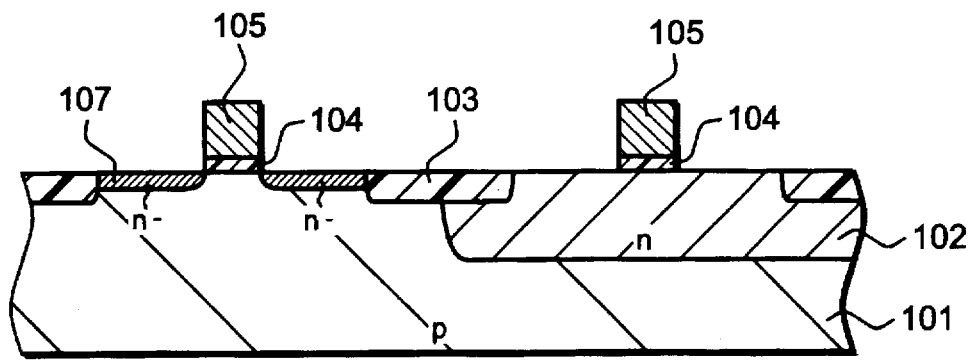
FIGS. 4A to 4E are sectional views of a semiconductor device for use in explaining a method for fabrication of a second embodiment according to the invention.
Figure 4B:
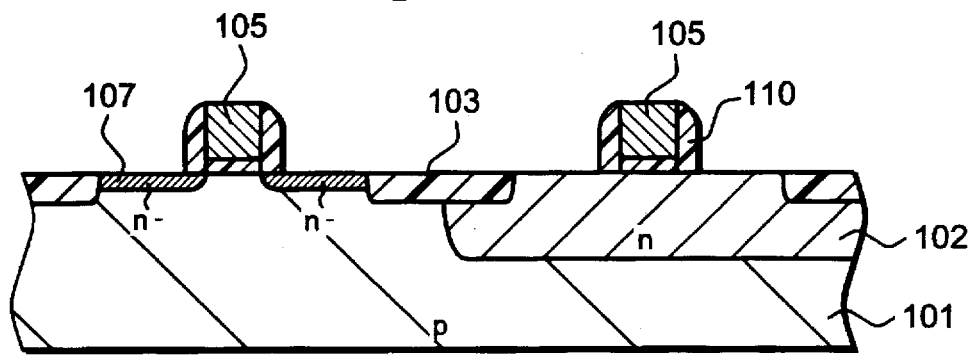
Figure 4C:
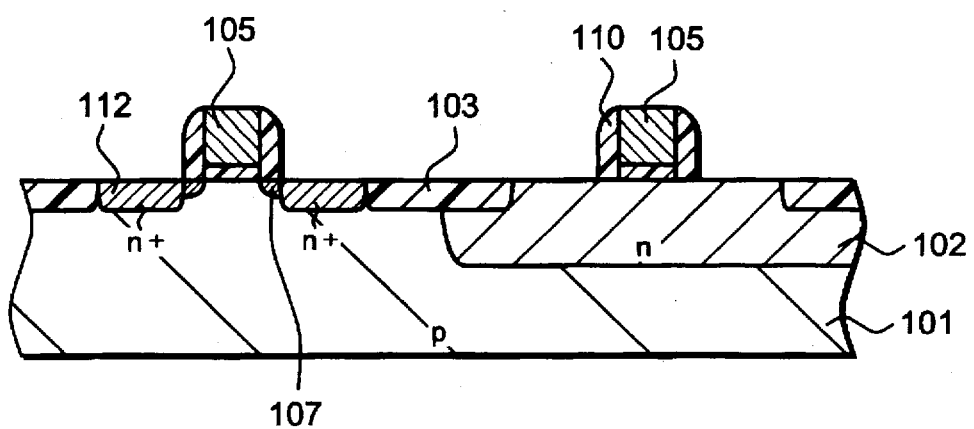
Figure 4D:
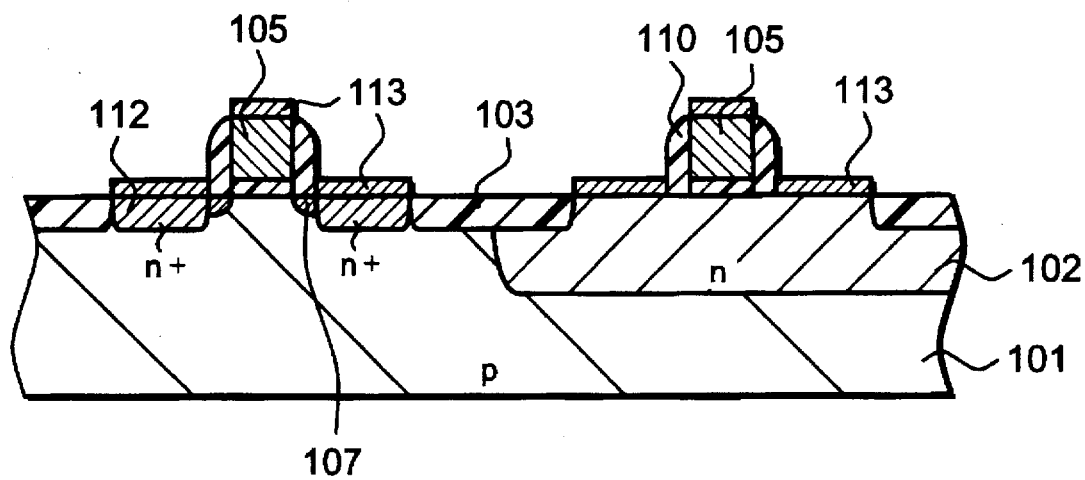
Figure 4E:
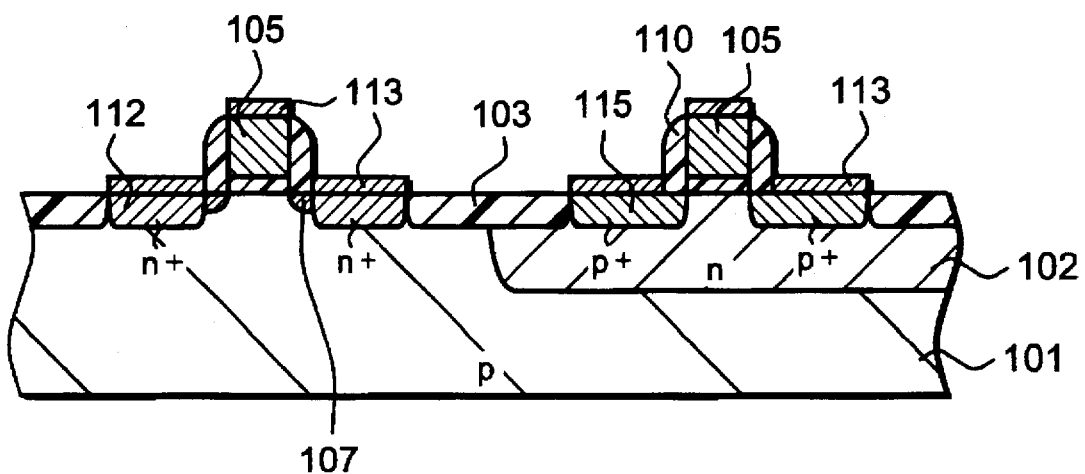

FIGS., 4A to 4E show a second embodiment of the invention. In the first embodiment the p-type LDD 109 of the p-type MOS transistor was formed, but such LDD need not be formed where the side walls 110 have a small width. As shown in FIG. 4A, an n-type LDD 107 of an n-type MOS transistor is formed and, as shown in FIG. 4B, the side walls 110 are formed without forming any p-type LDD of a p-type MOS transistor. Then, as shown in FIG. 4C, an n-type source/drain region 112 of the n-type MOS transistor is formed and, as shown in FIG. 4D, a silicon layer 113 is formed by selective epitaxial growth. A p-type source/drain region 115 of the p-type MOS transistor as shown in FIG. 4E is formed. When the side walls 110 have a width of about 50 nm, the Junction of the p-type source/drain region 115 of the p-type MOS transistor reaches the gate electrode end, and thus no LDD is necessary. The subsequent steps are like the step in FIG. 3H and the steps following the same.

Figure 5A:
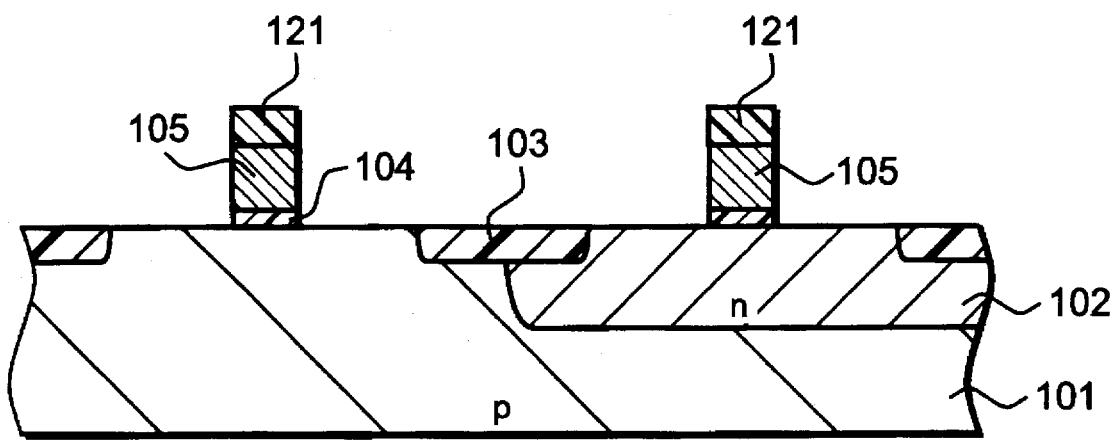
FIGS. 5A and 5B are sectional views of a semiconductor device for use in explaining a method for fabrication of a third embodiment according to the invention.
Figure 5B:
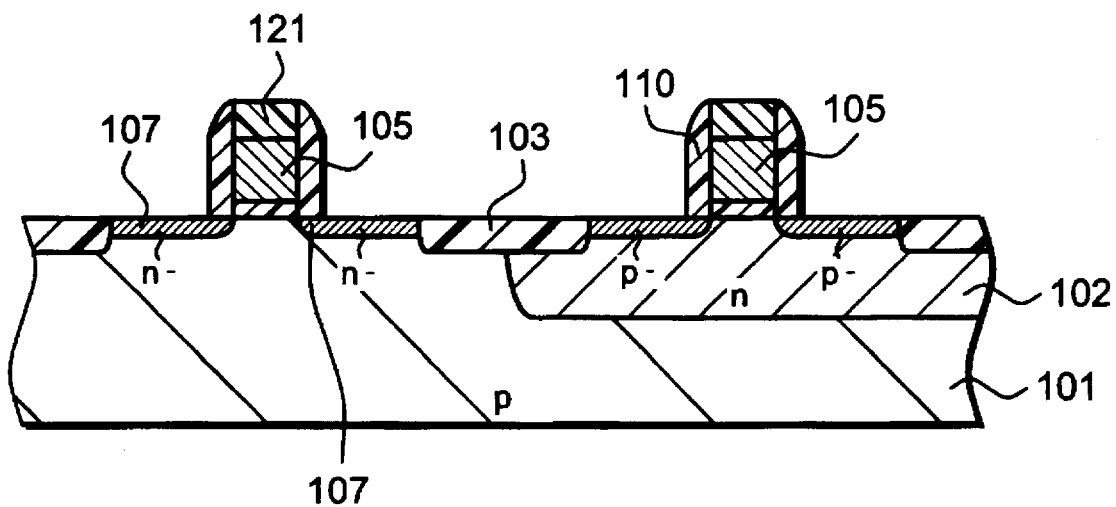

FIGS. 5A and 5B show a third embodiment of the invention. In the previous first embodiment the silicon layer is formed also on the gate electrode 105 by selective epitaxial growth of silicon. However, the impurity ion implantation into the source/drain region 115 of the p-type MOS transistor is made after the formation of the silicon layer 113 by the selective epitaxial growth. This means that no silicon layer may be formed on the gate electrode 105. As shown in FIG. 5A, an insulating film 121 of silicon oxide, for instance, is formed to a thickness of about 100 nm on the gate electrode 105 when forming the gate electrode 105. As shown in FIG. 5B, as in the first embodiment, side walls 110 are then formed after forming an n-type LDD 107 of an n-type MOS transistor and a p-type LDD 109 of a p-type MOS transistor. Thus, the silicon substrate 101 is exposed only in the source/drain region. The subsequent steps are like the step in FIG. 3E and the steps following the same.

The foregoing description concerned with the cases of using titanium as the high melting point metal. According to the invention, however, it is possible as well to use other high melting point metals such as cobalt, molybdenum, etc.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a semiconductor device which has a p-type MOS transistor and an n-type MOS transistor and also has a high melting point metal silicide layer formed at least on a source/drain region of each MOS transistor, said method comprising the steps of:

forming the source/drain region of said n-type MOS transistor through impurity introduction after forming a gate insulating film and a gate electrode of each of the MOS transistors on a silicon substrate;

forming a silicon layer on each of the source/drain regions of said n- and p-type MOS transistors;

forming the source/drain region of said p-type MOS transistor through said silicon layer; and forming said high melting point metal silicide layer by depositing a high melting point metal over an entire surface and causing a reaction of said high melting point metal with said silicon layer.

2. A method for fabricating a semiconductor device which has a p-type MOS transistor and an n-type MOS transistor and also has a high melting point metal silicide layer formed at least on a source/drain region of each MOS transistor, said method comprising the steps of:

forming the source/drain regions of at least one of said p-type MOS transistor and said n-type MOS transistor as low impurity concentration regions through impurity introduction after forming a gate insulating film and a gate electrode of each of said MOS transistors on a silicon substrate;

forming side walls on sides of said gate electrode of each of the MOS transistors;

forming the source/drain region of said n-type MOS transistor as a high impurity concentration region by ion implantation of an impurity;

forming a silicon layer by a selective epitaxial growth process on each of the source/drain regions of the n- and p-type MOS transistors;

forming the source/drain region of said p-type MOS transistor as a high impurity concentration region by ion implantation of a p-type impurity through said silicon layer;

forming a high melting point metal silicide layer by depositing a high melting point metal over an entire surface and causing a reaction of said high melting point metal with said silicon layer; and removing the high melting point metal remaining without the silicide reaction.

3. A method for fabricating a semiconductor device according to claim 2, wherein the low impurity concentration region is formed only at the source/drain region of said n-type MOS transistor.

4. A method for fabricating a semiconductor device according to claim 1, in which said silicon layer formed on the source/drain regions is impurity-free silicon.

5. A method for fabricating a semiconductor device according to claim 2, in which said silicon layer formed on the source/drain regions is impurity-free silicon.

6. A method for fabricating a semiconductor device according to claim 3, in which said silicon layer formed on the source/drain regions is impurity-free silicon.

7. A method for fabricating a semiconductor device according to claim 1, in which said high melting point metal is selected from the group consisting of titanium, cobalt and molybdenum, and said high melting point metal silicide layer is selected from the group consisting of a titanium silicide layer, a cobalt silicide layer and a molybdenum silicide layer.

8. A method for fabricating a semiconductor device according to claim 2, in which in which said high melting point metal is selected from the group consisting of titanium, cobalt and molybdenum, and said high melting point metal silicide layer is selected from the group consisting of a titanium silicide layer, a cobalt silicide layer and a molybdenum silicide layer.

9. A method for fabricating a semiconductor device according to claim 3, in which in which said high melting point metal is selected from the group consisting of titanium, cobalt and molybdenum, and said high melting point metal silicide layer is selected from the group consisting of a titanium silicide layer, a cobalt silicide layer and a molybdenum silicide layer.

10. A method for fabricating a semiconductor device according to claim 1, in which said silicon layer formed on the source/drain regions has a thickness of at least 30 nm.

11. A method for fabricating a semiconductor device according to claim 2, in which said silicon layer formed on the source/drain regions has a thickness of at least 30 nm.

12. A method for fabricating a semiconductor device according to claim 3, in which said silicon layer formed on the source/drain regions has a thickness of at least 30 nm.

13. A method for fabricating a semiconductor device according to claim 4, in which said silicon layer formed on the source/drain regions has a thickness of at least 30 nm.

14. A method for fabricating a semiconductor device according to claim 5, in which said silicon layer formed on the source/drain regions has a thickness of at least 30 nm.

15. A method for fabricating a semiconductor device according to claim 6, in которой said silicon layer formed on the source/drain regions has a thickness of at least 30 nm.

* * * * *